(12) United States Patent
Fukazawa et al.

(10) Patent No.: US 8,080,282 B2
(45) Date of Patent: Dec. 20, 2011

(54) METHOD FOR FORMING SILICON CARBIDE FILM CONTAINING OXYGEN

(75) Inventors: Atsuki Fukazawa, Tama (JP); Manabu Kato, Tama (JP); Nobuo Matsuki, Tama (JP)

(73) Assignee: ASM Japan K.K., Tokyo (JP)

( * ) Notice: Subject to any disclaimer, the term of this patent is extended or adjusted under 35 U.S.C. 154(b) by 1271 days.

(21) Appl. No.: 11/463,247

(22) Filed: Aug. 8, 2006

(65) Prior Publication Data

US 2008/0038485 A1   Feb. 14, 2008

(51) Int. Cl.
*H05H 1/24* (2006.01)
*C23C 16/00* (2006.01)
(52) U.S. Cl. ............... 427/249.15; 427/569; 427/249.1; 427/255.18; 427/255.23
(58) Field of Classification Search .................. 427/569, 427/249.15, 249.1
See application file for complete search history.

(56) References Cited

U.S. PATENT DOCUMENTS

| | | | |
|---|---|---|---|
| 3,984,726 A | 10/1976 | Ramler | |
| 5,228,206 A | 7/1993 | Grant et al. | |
| 5,580,421 A | 12/1996 | Hiatt et al. | |
| 5,698,352 A * | 12/1997 | Ogawa et al. | 430/14 |
| 6,284,050 B1 | 9/2001 | Shi et al. | |
| 6,352,945 B1 | 3/2002 | Matsuki et al. | |
| 6,383,955 B1 | 5/2002 | Matsuki et al. | |
| 6,432,846 B1 | 8/2002 | Matsuki | |
| 6,455,335 B1 | 9/2002 | Kohno et al. | |
| 6,486,082 B1 * | 11/2002 | Cho et al. | 438/789 |
| 6,514,880 B2 | 2/2003 | Matsuki | |
| 6,756,085 B2 | 6/2004 | Waldfried et al. | |
| 6,881,683 B2 | 4/2005 | Matsuki et al. | |
| 2001/0038894 A1 * | 11/2001 | Komada | 428/34.6 |
| 2002/0016085 A1 * | 2/2002 | Huang et al. | 438/798 |
| 2003/0068881 A1 * | 4/2003 | Xia et al. | 438/637 |
| 2003/0176030 A1 * | 9/2003 | Tsuji et al. | 438/200 |
| 2004/0009676 A1 * | 1/2004 | Kim et al. | 438/778 |
| 2004/0029400 A1 * | 2/2004 | Gaillard et al. | 438/778 |
| 2004/0089924 A1 * | 5/2004 | Yuasa et al. | 257/673 |
| 2006/0165904 A1 | 7/2006 | Ohara | |

OTHER PUBLICATIONS

Decrosta "Charge issues in high oxygen gas ratio TEOS PECVD film" 1996 J. Vac. Sci. 14 (3) p. 709-713.*
MSDS-diethyldiethoxysilane <https://fscimage.fishersci.com/msds/p7062.htm>.*

* cited by examiner

*Primary Examiner* — Timothy Meeks
*Assistant Examiner* — Mandy Louie
(74) *Attorney, Agent, or Firm* — Knobbe Martens Olson & Bear LLP

(57) ABSTRACT

A method for forming a silicon carbide film containing Si, C, O, H, and optionally N on a substrate placed in a reaction space, includes the steps of: introducing into the reaction space a precursor containing Si, C, O, and H and having at least one Si—O bond in its molecule; introducing into the reaction space an inert gas; applying RF power in the reaction space, wherein a ratio of a flow rate (sccm) of the inert gas to the RF power ($W/cm^2$) is controlled at 30-850; and thereby depositing on the substrate a silicon carbide film containing Si, C, O, H, and optionally N.

9 Claims, 9 Drawing Sheets

METHOD FOR FORMING SILICON CARBIDE FILM CONTAINING OXYGEN

BACKGROUND OF THE INVENTION

1. Field of the Invention

This invention relates generally to a semiconductor technique and more particularly to a silicon carbide film containing oxygen used as a barrier film for forming an interconnect structure or as an anti-refractive film for photolithography, which is formed by plasma polymerization.

2. Description of the Related Art

Under the plasma chemical vapor deposition method (plasma CVD method), a thin film such as an interlayer insulation film, passivation film or anti-refractive film is deposited on a semiconductor substrate in an atmosphere of 1 Torr to 10 Torr by placing the semiconductor substrate, being the processing target, on a resistance-heating heater or other heater that has been heated to a temperature of 50° C. to 550° C. The heater is placed on the opposite side of a shower plate that releases a reaction gas, and high-frequency power is applied to the shower plate to cause high-frequency discharge between the heater and shower plate and thereby generate plasma. Deposition of a thin silicon carbide film on a semiconductor substrate is implemented by applying a high-frequency power of 13.56 MHz to 60 MHz or other frequencies at 300 W to 1,000 W, as well as a low-frequency power of 400 kHz at 50 to 200 W, to the shower plate to cause plasma discharge between the heater and shower plate. Here, 4MS, 3MS, 1MS or other material is used for forming a silicon insulation film, while $CO_2$, $O_2$, $NH_3$, $N_2$ or alcohol is used as an additive gas to break down the process gas introduced as a result of discharge.

Semiconductor devices use Cu wires offering higher thermal durability and lower resistance than conventional Al wires, in order to solve the problem of greater RC delays caused by increasingly finer patterns. As the design dimensions of devices decrease, the dielectric constants of interlayer insulation films are becoming lower, and 130-nm devices are using SiOF films with a dielectric constant of approx. 3.4 to 3.7. The importance of resistance is also increasing with wiring materials, and manufacturers have shifted from Al (aluminum) wires to Cu (copper) wires offering lower resistance. However, Cu is subject to significant diffusion under heat, and thus requires a barrier film to block diffusion. Since conventional low-dielectric-constant films (low-k films) offer poor capability when it comes to blocking Cu diffusion, they do not provide effective barrier films. For this reason, silicon carbide films are used as barrier films.

Barrier films must satisfy numerous requirements, and a barrier film not satisfying all these requirements cannot be applied successfully. An appropriate thickness of silicon carbide film is determined after conducting a Cu diffusion test to confirm the region over which Cu is diffused. Since the dielectric constant of the entire wiring layer must be lowered, it is desirable to keep the silicon carbide film as thin as possible while suppressing Cu diffusion into the silicon carbide film. From the viewpoint of device performance, the required duration of thermal durability test is 14 hours in a 400° C. atmosphere. Since Cu also diffuses under application of electricity, the BTS test is conducted where the two causal factors—namely, heat and electricity—are applied. Passing the BTS test demonstrates the satisfaction by the tested film of the functional requirements for Cu-diffusion blocking film. As a simplified test, a sample comprising a silicon carbide film deposited on Cu is exposed to a 400° C. atmosphere for 4 hours. If the level of Cu diffusion into the silicon carbide film does not exceed 20 nm, the sample is considered acceptable.

The need for insulation films with a lower dielectric constant has made it a requirement for barrier films to also have a low dielectric constant, and silicon carbide films have been adopted as barrier films. With 100-nm devices, low-k films with a dielectric constant of approx. 2.9 to 3.2 are used as insulation films, while films made of SiCN, SiCO, etc., with a dielectric constant of approx. 4.5 to 5.0 are used as barrier films.

In particular, it is important that barrier films not only block Cu diffusion, but also block moisture penetration to prevent moisture absorption and consequent oxidization of the Cu wire in the bottom layer. In view of these requirements, N, O and other impurities are added to a pure silicon carbide film to improve moisture penetration resistance. When impurities are added, however, lowering the dielectric constant to 4.0 or below becomes difficult. With 65-nm devices where the dielectric constant required of the barrier film is 4.0 or below, silicon carbide films not containing impurities are being evaluated for many applications. When its dielectric constant decreases, however, a pure silicon carbide film becomes notably less stable over time compared to conventional SiCN and SiCO films. The most troublesome factor is that oxidization of the Cu surface accelerates due to moisture penetration, which is fatal in device applications. One plausible explanation is a lower film density of 1.1 to 1.3 $kg/cm^3$, compared to 1.8 to 2.0 $g/cm^3$ with SiCN and SiCO films. There is another area of concern that, because of this lower density, the effect of $NH_3$ (ammonia) treatment used for Cu surface reduction might cause a problem in resist pattern forming. To improve these drawbacks, sometimes a film resistant to moisture penetration and also having a relatively high dielectric constant is used as a cover film both above and below of a bulk barrier film. Since barrier films used in devices must have a small thickness of 10 to 50 nm, however, existence of cover films above and below the barrier film will make the etching processing complex due to the control conditions needed to keep the cover films thin, and it will also increase the dielectric constant due to the multi-layer structure. In the meantime, one key factor in ensuring stability is to eliminate free bonds from the film. Therefore, when impurities are added to SiCN and SiCO films, it is necessary to add impurities to achieve stability. Traditional silicon carbide films made of 4MS and 3MS also present problems, such as achieving a low dielectric constant is difficult with SiCO and SiCN and process margins are narrow.

On the other hand, SiON-based films have traditionally been used as anti-refractive films for lithography. Since the mainstream lithography wavelength was 248 nm, the required film quality was determined by the specifications of lithography and the film used in the bottom layer. In other words, n (reflection factor) and k (extinction coefficient) determined from these factors were important. When the wavelength was 248 nm, there were less limitations on the resist and consequently less limitations on the anti-refractive film. However, times have changed and the wavelength used for lithography has also changed from 248 nm to 193 nm, accompanied by notable changes in processing structures. It is expected that this shorter lithography wavelength will change the resist material and ultimately present a new set of problems such as poisoning due to resist degradation.

SUMMARY OF THE INVENTION

In an embodiment, it is an object to form a silicon carbide film containing oxygen having a low dielectric constant while maintaining a relatively high film density. In an embodiment, it is an object to form a silicon carbide film containing oxygen having excellent moisture penetration blocking property. In an embodiment, it is an object to form a silicon carbide film containing oxygen without using an oxidizing gas so that the film can be deposited directly on a copper layer. In an embodiment, it is an object to form an excellent barrier film. In an embodiment, it is an object to form a silicon carbide film containing oxygen having excellent optical property for photolithography. In an embodiment, it is an object to form an excellent anti-refractive film. In an embodiment, it is an object to provide a method for controlling the relationship between dielectric constant and film density of a silicon carbide film containing oxygen. In an embodiment, it is an object to form a silicon carbide film containing oxygen and nitrogen, which possess improved characteristics as a barrier film. In an embodiment, it is an object to form a silicon carbide film containing oxygen having excellent adhesion to an underlying layer such as SiCN.

One aspect of the present invention may involve a method for forming a silicon carbide film containing Si, C, O, H, and optionally N on a substrate placed in a reaction space. In an embodiment wherein one or more of the above objects can be achieved, the method may comprise the steps of: (i) introducing into the reaction space a precursor containing Si, C, O, and H and having at least one Si—O bond in its molecule; (ii) introducing into the reaction space an inert gas; (iii) applying RF power in the reaction space, wherein a ratio of a flow rate (sccm) of the inert gas to the RF power (W/cm$^2$) is controlled at more than zero but no more than about 850 (e.g., 30-850); and (iv) thereby depositing on the substrate a silicon carbide film containing Si, C, O, H, and optionally N.

In another embodiment wherein one or more of the above objects can be achieved, the method may comprise: (i) a step of introducing into the reaction space a precursor containing Si, C, O, and H and having at least one Si—O bond in its molecule and an inert gas; (ii) a step of applying RF power in the reaction space; and (iii) a step for depositing on the substrate a silicon carbide film containing Si, C, O, H, and optionally N, while adjusting a dielectric constant (k) and a density ($\rho$, g/cm$^3$) of the depositing silicon carbide film to satisfy the following equation:

$1.6 \cdot \rho \leq k \leq 1.6 \cdot \rho + 1.0$.

Another aspect of the present invention may involve a silicon carbide film having a dielectric constant (k) and a density ($\rho$, g/cm$^3$) which satisfy the following equation:

$1.6 \cdot \rho \leq k \leq 1.6 \cdot \rho + 1.0$, wherein one or more of the above objects can be achieved.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

Figure 1:
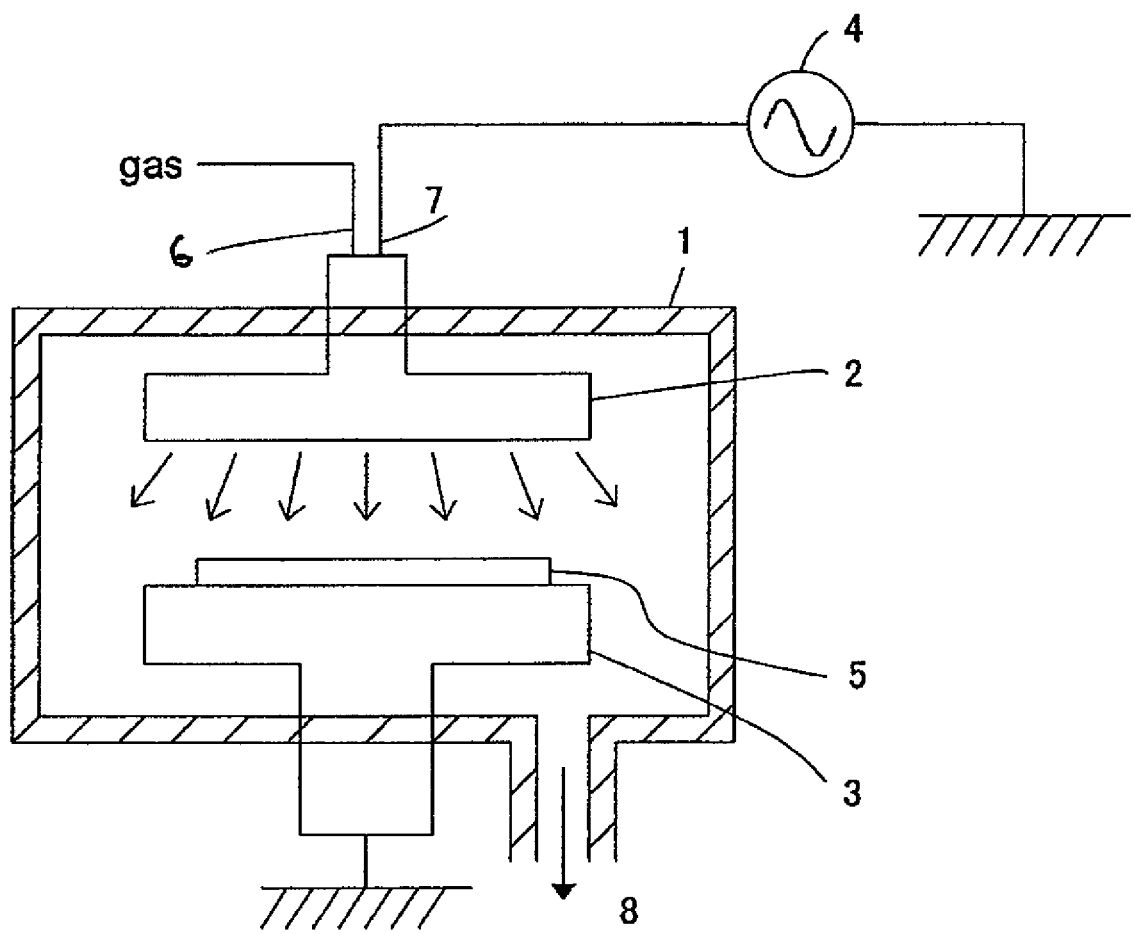
FIG. 1 is a schematic diagram showing a plasma CVD apparatus according to an embodiment of the present invention.

Explanation of symbols used is as follows: 1: Reactor; 2: Upper electrode; 3: Lower electrode; 4: Radio-frequency (RF) generator; 5, 16: Semiconductor substrate; 6: Gas inlet port; 7: RF supply port; 8: Exhaust port; 11: Curing chamber; 12: UV lamp; 13: Susceptor heater; 14: Exhaust port: 15: Gas inlet port.

DETAILED DESCRIPTION OF THE PREFERRED EMBODIMENT

To maintain the density of a silicon carbide film within a certain range while achieving a low dielectric constant, or to lower the dielectric constant of a silicon carbide film relative to the film's density, or to suppress rise in the dielectric constant when the film density is increased, it is necessary to select an appropriate material and additives to stabilize bonds in the film. In one embodiment of the present invention, the aforementioned object is achieved by using a material gas containing at least one Si—O bond in its molecule, and also adjusting to specified range the ratio of the flow rate of the inert gas to the RF power—both of which are parameters not directly contributing to the chemical reaction. A silicon carbide film formed this way exhibits an excellent Cu-diffusion blocking effect unlike other low-k films. In one embodiment, diffusion and penetration of Cu beyond 20 nm, or preferably 10 nm, in the thickness direction of the film can be prevented to no more than the detection limit. In one embodiment, it has been confirmed that the obtained film, although comprising a material similar to those used in the formation of low-k films, exhibits a low dielectric constant and high film density (thereby providing a Cu-diffusion blocking function), while a low-k film having the same dielectric constant or an equivalent dielectric constant does not provide such Cu-diffusion blocking function.

Here, the silicon carbide film conforming to the present invention contains impurities, particularly oxygen (nitrogen may also be contained). This silicon carbide film containing impurities exhibits an excellent Cu-diffusion blocking effect as well as excellent resistance to moisture penetration. Such silicon carbide film is effective not only as a barrier film, but also as an anti-refractive film.

To achieve at least one of the objects explained above, in one embodiment a capacity-coupling plasma generator is used to obtain a barrier film offering improved moisture penetration resistance, higher density and lower dielectric constant, by using a material gas of silicon hydrocarbon compound expressed by a general formula $Si_aC_bH_c$ (in the formula, a, b and c are arbitrary integers), where this material gas incorporates an oxygen group (O group) bond between Si and $CH_3$ unlike 1MS, 3MS or 4MS constituted by Si—$CH_3$ bond. This way, a stable high-density film can be formed. In the aforementioned embodiment, no oxidizing agent is required because the material contains Si—O bond, which improves the stability of the film. In one embodiment, the ratio of the dilution gas to the high-frequency power, both of which are process parameters, is controlled within a range of 4:1 to 1:6 (inert gas (sccm): high-frequency power (W)), or within a range of 1257:1 to 52:1 (inert gas (sccm): high-frequency power per unit substrate area ($W/cm^2$)), because this ratio affects the propensity for density increase. In one embodiment, successful achievement of a high density and improved moisture penetration resistance allows for suppression of permeation of nitrogen groups (N groups) into the film during $NH_3$ treatment, thereby improving the problem of poisoning. In one embodiment, a higher density results in a higher etching selectivity with respect to the insulation film, which facilitates the etching process of a damascene structure. If the stability and selectivity must be improved further, it can be achieved by adding nitrogen groups (N groups) to the film.

As for patterning, the change in lithography wavelength from 248 nm to 193 nm and shift in the resist pattern to a multi-layer structure are giving rise to a concern over a problem in resist pattern forming due to poisoning. In one embodiment, a SiCO film free from nitrogen groups (N groups) is provided to avoid the effect from a traditional SiCN anti-refractive film. To be specific, the resist pattern resolution may become defective if N groups are contained in the anti-refractive film that directly contacts the resist, when lithography is implemented with ArF with a wavelength of 193 nm in the via etching process based on VFTL (Via First-Trench Last), etc. In this case, a silicon carbide film not containing N groups is used. In one embodiment, an optical constants of 1.4 to 2.0 for n and 0.10 to 0.45 for k are achieved at a lithography wavelength of 193 nm and therefore the film satisfies the required anti-refractive function. Here, although these values are determined by the optical constants obtained from specific specifications such as the etching stopper film in the foundation, the film can satisfy the required anti-refractive function as long as n and k are within the aforementioned ranges.

With conventional SiCO films, direct deposition of a film on Cu is difficult because the use of 4MS, 3MS, 1MS or other similar material gas requires an oxidizing material, such as $O_2$ or $CO_2$, to be used during the thin film deposition process. To improve resistance to moisture penetration, a thin SiCN film is deposited before SiCO is deposited. In this case, the total dielectric constant may increase and successive film deposition processes may be required. Furthermore, as its dielectric constant decreases, a SiCO film will also present a problem regarding adhesion with a SiCN film. In one embodiment of the present invention, at least these problems can be improved.

The present invention will be explained below with reference to preferred embodiments. However, the preferred embodiments are not intended to limit the present invention. In the present disclosure where conditions and/or structures are not specified, the skilled artisan in the art can readily provide such conditions and/or structures, in view of the present disclosure, as a matter of routine experimentation.

In an embodiment, a method for forming a silicon carbide film containing Si, C, O, H, and optionally N on a substrate placed in a reaction space, comprises the steps of: (i) introducing into the reaction space a precursor containing Si, C, O, and H and having at least one Si—O bond in its molecule; (ii) introducing into the reaction space an inert gas; (iii) applying RF power in the reaction space, wherein a ratio of a flow rate (sccm) of the inert gas to the RF power ($W/cm^2$; W per unit area of the substrate) is controlled at about 30 to about 850, for example (including 50, 100, 200, 300, 400, 500, 600, 700, and values between any two numbers of the foregoing, preferably 30-550); and (iv) thereby depositing on the substrate a silicon carbide film containing Si, C, O, H, and optionally N.

The above embodiment includes, but is not limited to, the following embodiments:

The ratio of the flow rate of the inert gas to the RF power may be controlled to adjust a dielectric constant (k) and a density ($\rho$, $g/cm^3$) of the depositing silicon carbide film to satisfy the following equation:

$$1.6 \cdot \rho \leq k \leq 1.6 \cdot \rho + 1.0.$$

The equation can be expressed as follows: $(1.6 \cdot \rho + a) \leq k \leq (1.6 \cdot \rho + b)$, wherein $0 \leq a$; $b \leq 1.0$; $a \leq b$. In the above, in an embodiment, a is 0.1, 0.2, 0.3, 0.4, 0.5, or values between any two numbers of the foregoing, and b is 0.5, 0.6, 0.7, 0.8, 0.9, or values between any two numbers of the foregoing. Any combination of a and b above can be employed. For example, a is 0.2 and b is 0.8, a is 0.3 and b is 0.7. In the above, the inequity may be satisfied when the dielectric constant and the density fall within certain ranges which the skilled artisan in the art could readily accept or which is that explained below.

The silicon carbide film has relatively low dielectric constant with respect to the density. In other words, if the silicon carbide film has the same density as a conventional silicon carbide film, its dielectric constant is lower than that of the conventional silicon carbide film. By using the precursor containing at least one Si—O bond in its molecule and controlling the above ratio, the chemical structure of the depositing film can be stabilized without reducing the density. The resulting film can exhibit an excellent moisture penetration inhibition property, copper diffusion blocking property, and/or excellent refractive index (n) and extinction coefficient (k) at 193 nm. The depositing silicon carbide film may have a dielectric constant of less than 4.5, preferably 4.0 or lower (e.g., 2.7-4.0, 2.8-3.8). The depositing silicon carbide film may have a density of less than 2.4 $g/cm^3$, preferably 2.2 $g/cm^3$ or less (e.g., 1.4-2.0 $g/cm^3$).

In an embodiment, in the reaction space, the RF power may be applied at 0.1-10 $W/cm^2$ (including 0.3 $W/cm^2$, 1 $W/cm^2$, 3 $W/cm^2$, 6, 9 $W/cm^2$, and values between any two numbers of the foregoing, preferably 0.3-7 W/cm² (1-5 W/cm²) and the inert gas may be introduced at a flow rate of 20-1,500 sccm (including 50 sccm, 100 sccm, 500 sccm, 1,000 sccm, and values between any two numbers of the foregoing, preferably 100-1,100 sccm or less than 1,100 sccm). In an embodiment, the inert gas may be selected from the group consisting of He, Ar, Kr, and Xe. In another embodiment, nitrogen gas such as $N_2$ can be used as the inert gas or nitrogen-supplying gas can be added so as to incorporate N in the silicon carbide film which contains Si, C, O, H, and N, depending on its flow rate. In an embodiment, the flow rate of nitrogen gas may be 20-3,000 sccm (including 50 sccm, 100 sccm, 500 sccm, 1,000 sccm, 2,000 sccm, and values between any two numbers of the foregoing, preferably 100-2,000 sccm). The above described inert gases can be used in any combination or singly.

In an embodiment, the RF power may have a high frequency and a low frequency, said high frequency being 13.56 MHz, 27 MHz, or 60 MHz, said low frequency being 5 MHz or lower (e.g., 400 kHz, 430 kHz). In an embodiment, only high-frequency RF power may be used. The ratio of the low-frequency RF power to the high-frequency RF power may be, for example, in the range of 0 to 1, e.g., 1/99 to 49/51; 5/95 to 20/80. In an embodiment, the RF power in the ratio of the flow rate of the inert gas to the RF power may be the high-frequency RF power (the low-frequency RF power is not used for calculation of the ratio).

The method may further comprise forming a copper layer prior to the step of forming the silicon carbide film, wherein the silicon carbide film is formed on top of the copper layer as a barrier layer wherein the barrier layer may have excellent moisture penetration inhibition property (e.g., a Si—OH peak may have an area less than 0.15% of the total area as measured with FT-IR after being kept for 10 hours in an environment of 75-85% humidity and 120° C.) and excellent copper diffusion blocking property (e.g., a copper penetration depth may be of 20 nm or less as measured when the silicon carbide film is deposited on a copper layer and kept at 400° C. for four hours).

Alternatively, the method may further comprise forming a layer-to-be-etched by photolithography prior to the step of forming the silicon carbide film, wherein the silicon carbide film is formed on the layer-to-be-etched as an antireflection layer wherein the antireflection layer may have a refractive index (n) of 1.1 to 2.3 in an embodiment, preferably 1.4 to 2.0 in an embodiment, and an extinction coefficient (k) of 0.08 to 0.60 in an embodiment, preferably 0.10 to 0.45 in an embodiment, at 193 nm.

In an embodiment, the silicon carbide film may be deposited at a thickness of 5-150 nm in an embodiment, preferably 10-50 nm in an embodiment or 15-100 nm in an embodiment.

In an embodiment, the precursor gas may be an organosilicon gas having a general formula $Si_aO_bC_xH_y$ wherein, a, b, x, and y are arbitrary integers. The organosilicon gas may be a silicon-containing hydrocarbon compound which has the formula $Si_\alpha O_{\alpha-1} R_{2\alpha-\beta+2}(OR')_\beta$ wherein α is an integer of 1-3, β is 0, 1, or 2, n is an integer of 1-3, R is $C_{1-6}$ hydrocarbon attached to Si, and R' is $C_{1-6}$ hydrocarbon unattached to Si. R' may be $C_nH_{2n+1}$ wherein n is an integer of 1-3. In embodiments, the silicon-containing hydrocarbon compound comprising at least one Si—O bond in a molecule includes, but is not limited to, the following:

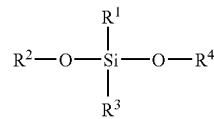

wherein $R^1$, $R^2$, $R^3$ and $R^4$ are independently any one of $CH_3$, $C_2H_5$, $C_3H_7$, $C_6H_5$, $C_2H_3$, $C_3H_5$, $C_4H_7$ and $C_4H_5$,

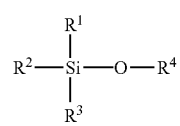

wherein $R^1$, $R^2$, $R^3$ and $R^4$ are independently any one of $CH_3$, $C_2H_5$, $C_3H_7$, $C_6H_5$, $C_2H_3$, $C_3H_5$, $C_4H_7$ and $C_4H_5$;

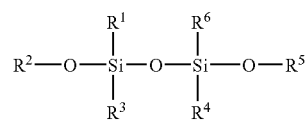

wherein $R^1$, $R^2$, $R^3$, $R^4$, $R^5$ and $R^6$ are independently any one of $CH_3$, $C_2H_5$, $C_3H_7$, $C_6H_5$, $C_2H_3$, $C_3H_5$, $C_4H_7$ and $C_4H_5$; and

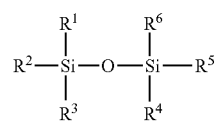

wherein $R^1$, $R^2$, $R^3$, $R^4$, $R^5$ and $R^6$ are independently any one of $CH_3$, $C_2H_5$, $C_3H_7$, $C_6H_5$, $C_2H_3$, $C_3H_5$, $C_4H_7$ and $C_4H_5$.

In embodiments, the precursor may be selected from those disclosed in U.S. Pat. Nos. 6,881,683, 6,514,880, 6,352,945, 6,383,955, and 6,432,846, all of which are incorporated herein by reference in their entirety.

One or more of the precursors represented by any of the aforesaid formulae can be used. For example, dimethyldimethoxysilane (DMDMOS, $SiO_2C_4H_{12}$), diethyldiethoxysilane (DEDEOS, $SiO_2C_8H_{20}$), phenyltrimethoxysilane (PTMOS, $SiO_4C_9H_{14}$), 1,3-dimethoxytetramethyldisilane (DMOTMDS, $Si_2O_3C_6H_{18}$), and hexamethydisilane (HMDS, $Si_2OC_6H_{18}$) are included. In an embodiment, cyclic silicon-containing hydrocarbon compounds having a Si—O bond can be used. Preferably, however, linear silicon-containing hydrocarbon compounds having a Si—O bond, more preferably, O—Si—O bond, may be used in an embodiment.

The flow rate of the precursor gas may be 25-1,000 sccm (including 50 sccm, 100 sccm, 200 sccm, 500 sccm, and values between any two numbers of the foregoing, preferably 50 sccm to 400 sccm). In an embodiment, the flow rate of the precursor gas may be no more than that of the inert gas (e.g., 10%, 20%, 40%, 60%, 80% of the flow rate of the inert gas, and values between any two numbers of the foregoing).

In an embodiment, the method may further comprise introducing an additive gas selected from the group consisting of a gas of $CO_2$, $H_2$, $C_nH_{2n+2}$ (n is an integer of 1-5), $C_nH_{2n}$ (n is an integer of 1-5), and/or $C_nH_{2n+1}O$ (n is an integer of 1-5), depending on the intended purpose of the resulting thin film which requires certain characteristics. In an embodiment, $C_6H_{6-n}R_n$ (n is 0, 1, 2, or 3, R is one of —$CH_3$, —$C_2H_5$, —CH=CH) may be added in order to reduce the dielectric constant in a range of 2.8-3.2.

When $C_2H_4$, $C_2H_6$, $C_3H_6$, $C_3H_8$, $C_6H_6$, $C_6H_aR_{(6-a)}$ (a is an integer of 0-6, R is $C_{1-6}$ alkyl), $C_2H_5(OH)$, or $C_3H_7(OH)$, for example, is introduced into the reaction space when the precursor gas is introduced, unstable bonds or terminals of Si can be further stabilized. These gases do not typically serve as an oxygen-supplying gas which supplies oxygen to be bound to Si (i.e., even if a molecule of the gas contains oxygen, the oxygen is insignificantly involved in formation of a basal structure of the resulting film) or crosslinking gas (i.e., a molecule of the gas is insignificantly involved in formation of a basal structure of the resulting film). In an embodiment, the additive gas may be introduced at a flow rate which is less than that of the precursor gas.

In an embodiment, no oxidizing gas may be added to the precursor, because the precursor contains at least one Si—O bond in its molecule. The precursor and the inert gas may be exclusively introduced into the reaction space.

In an embodiment, the average temperature of the reaction may be in a range of 50° C. to 550° C. or 300° C. to 450° C. or 370° C.-430° C. or any combination of the foregoing. In an embodiment, the pressure of the reaction space may be in a range of 400-900 Pa.

The silicon carbide film is doped with oxygen. The oxygen content may be 5% to 30% (including 10%, 15%, 20%, 25%, and values between any two numbers of the foregoing). The silicon carbide film may be composed further of N. The silicon carbide film may be a barrier film for blocking Cu-diffusion.

The space between the silicon substrate and the upper electrode may be less than 0.014 m (including 0.012 m, 0.010 m, 0.008 m, 0.006 m, and values between any two numbers of the foregoing).

The substrate may have a via and/or trench is formed wherein the silicon carbide film is to be formed on a surface of the via and/or trench. The substrate may have an exposed Cu layer on which the silicon carbide film is to be formed. When no oxygen-supplying gas is used, the silicon carbide film can be deposited directly on a Cu layer.

In all of the aforesaid embodiments, any element used in an embodiment can interchangeably or additionally be used in another embodiment in combination with the other elements unless such a replacement or addition is not feasible or causes adverse effect.

In another embodiment, a method for forming a silicon carbide film containing Si, C, O, H, and optionally N on a substrate placed in a reaction space, may comprise: (i) a step of introducing into the reaction space a precursor containing Si, C, O, and H and having at least one Si—O bond in its molecule and an inert gas; (ii) a step of applying RF power in the reaction space; and (iii) a step for depositing on the substrate a silicon carbide film containing Si, C, O, H, and optionally N, while adjusting a dielectric constant (k) and a density ($\rho$, g/cm$^3$) of the depositing silicon carbide film to satisfy the following equation:

$$(1.6 \cdot \rho + a) \leq k \leq (1.6 \cdot \rho + b), \text{ wherein } a=0\text{-}0.5, b=0.5\text{-}1.0.$$

All of the embodiments described earlier can be applied to the above. Further, the present invention equally relates to a silicon carbide film having the dielectric constant (k) and the density ($\rho$, g/cm$^3$) which satisfy the above equation. All of the embodiments described earlier can be applied to the above.

The film formation step in an embodiment of the present invention can be practiced using a plasma CVD apparatus shown in FIG. 1. The plasma CVD apparatus comprises a reactor 1, an upper electrode 2, a lower electrode 3, a gas inlet port 6, and an RF introduction portion 7. The upper electrode 2 and the lower electrode 3 are disposed facing and parallel to each other, and are heated by heaters embedded in them respectively. A semiconductor substrate 5, which is a workpiece, is placed on the lower electrode 3 and is heated and held. On a bottom surface of the upper electrode 2, a number of fine pores are provided, from which a jet of gas is emitted supplied from the gas inlet port 6. RF power is supplied from a RF generator 4; the gas inlet port 6 and the RF introduction portion 7 are electrically isolated.

A silicon carbide film is deposited on a semiconductor, being the processing target, using plasma generated by a process gas introduced to the reactor under a combination of high-frequency power and low-frequency power or single frequency power.

As for the silicon hydrocarbon, DMDMOS, HMDSO, DMOTMDS, etc., can be used, among others.

The dilution gas may be $N_2$, He, Ar, Kr, Xe or any combination thereof. Since these gases have different levels of ionizing energy and cross-section area of collision, respectively, the reaction occurring in the vapor phase can be controlled by changing the gas or combination of gases.

Once an insulation film is deposited on the semiconductor substrate, the gas inside the reactor is exhausted from an exhaust port 8 while the semiconductor substrate is still retained in the reactor, and thus the gas in the reactor is replaced with a reducing gas or with a mixed gas consisting of a reducing gas and an inert gas. The resulting SiCO or SiCON silicon carbide film offers a higher film density and lower dielectric constant compared to a conventional film deposited using 4MS. To be specific, in one embodiment the resulting film has a dielectric constant of 2.8 to 3.8 and film density of 1.4 to 2.0, while the dielectric constant and film density of a conventional 4MS film are 4.3 to 4.8 and 1.8 to 2.0, respectively. Although the film density is roughly equivalent between the two films, the dielectric constant is significantly lower with the silicon carbide film.

Density drop due a lower dielectric constant can be suppressed by using a specific precursor. Also, inert gas and high-frequency power are two parameters having a significant bearing on density control. The ratio of the flow rate of the inert gas (sccm) to the high-frequency power per unit substrate area (W/cm$^2$) is important in achieving a lower dielectric constant and higher density. Desired outcomes can be achieved by maintaining this ratio within a range of 20 to 1250, or preferably 30 to 850, or more preferably 50 to 600. Although no additive gas is used in a representative embodiment, the aforementioned ratios also apply when an additive gas is used.

In an embodiment, a low-dielectric-constant structure is formed on a semiconductor workpiece by process gases introduced into the reactor and by plasma generated by RF discharge. This film can be complete without a subsequent curing process such as a UV curing process. As necessary, subsequently, a curing process using a UV cure apparatus shown in FIG. 2 can be performed, thereby further improving desired properties of a silicon carbide film.

When a silicon carbide film has been formed on a semiconductor substrate, with the semiconductor being held inside the reactor, gases inside the reactor are exhausted from an exhaust port 8.

In an embodiment, subsequently, a curing process can be performed on the semiconductor substrate taken out from the reactor using the UV cure apparatus shown in FIG. 2. The UV cure apparatus comprises a process chamber 11, a UV lamp 12, a susceptor 13, an exhaust port 14, and a gas inlet port 15. The UV lamp and a susceptor 13 are disposed parallel, and are heated by heaters embedded in them respectively. The semiconductor substrate 16, which is a workpiece, is placed on the susceptor 13 and is heated and held. Projected from the UV lamp whose wavelength range is selected from 172-250 nm, light is irradiated toward the semiconductor substrate 16. When the semiconductor substrate is irradiated, gases such as He, $H_2$, $N_2$, $CO_2$, etc. are being introduced through the gas inlet port 15. As soon as pores are formed in the film with H, O, C, etc. being desorbed from a low-dielectric-constant structure, unstable bonds no longer exist; hence, a film having a lower dielectric constant and higher strength can be obtained.

As the UV cure apparatus, the apparatus disclosed in commonly assigned U.S. patent application Ser. No. 11/040,863 can be used, the disclosure of which is incorporated herein by reference in its entirety.

According to one embodiment of ultraviolet light treatment, with pressures inside the chamber being set around atmospheric pressure of about 0.1 Torr using gas selected from Ar, He, Kr, Ne, $N_2$, Xe (a gas flow rate can be selected from about 0.1 sccm to about 20 slm in one embodiment, preferably about 500 sccm to about 1000 sccm, but preferably in the absence of oxidizing gas), and by placing a substrate on a heater whose temperature is set at about 0° C. to about 650° C., ultraviolet light at a wavelength of about 100 nm to about 400 nm, and an output of about 1 $mW/cm^2$ to about 500 $W/cm^2$, preferably about 1 $mW/cm^2$ to about 50 $mW/cm^2$, more preferably about 3 $mW/cm^2$ to about 10 $mW/cm^2$ can be emitted from ultraviolet light emitters disposed at an appropriate distance continuously or in a pulsed manner at frequencies of about 0 Hz to about 1000 Hz to a thin film formed on a semiconductor substrate with the heater being rotating on its center.

EXAMPLE

Embodiments of the present invention will be explained below with reference to preferred examples. However, the preferred examples are not intended to limit the present invention. The skilled artisan in the art can readily modify the gases and/or conditions in view of the present disclosure, as a matter of routine experimentation.

Experiments were conducted as described below. In these experiments, an ordinary plasma CVD device (EAGLE®-10, ASM Japan K.K.) was used as an experimental device wherein:

Example 1

Film thickness: 50 nm
Susceptor temperature: 390° C.
Flow rate of DM-DMOS: 100 sccm
Pressure: 630 Pa
Flow rate of He: 500 sccm
Power at 27.12 MHz: 400 W (1.2 $W/cm^2$)
Power at 430 kHz: 100 W (0.3 $W/cm^2$)
Dielectric constant: 3.9 (200 nm)
Leak current (2 MV/cm): 1.59E-10
Withstand pressure: 6.9 MV/cm
Modulus: 70 GPa
Film density: 2.2 $g/cm^3$
Flow rate of inert gas (sccm)/high-frequency power ($W/cm^2$)=393

Example 2

Film thickness: 50 nm
Susceptor temperature: 390° C.
Flow rate of DM-DMOS: 100 sccm
Pressure: 630 Pa
Flow rate of He: 400 sccm
Power at 27.12 MHz: 400 W (1.2 $W/cm^2$)
Power at 430 kHz: 100 W (0.3 $W/cm^2$)
Dielectric constant: 3.8 (200 nm)
Leak current (2 MV/cm): 3.12E-10
Withstand pressure: 7 MV/cm
Modulus: 65 GPa
Film density: 2.05 $g/cm^3$
Flow rate of inert gas (sccm)/high-frequency power ($W/cm^2$)=314

Example 3

Film thickness: 50 nm
Susceptor temperature: 390° C.
Flow rate of DM-DMOS: 100 sccm
Pressure: 630 Pa
Flow rate of He: 300 sccm
Power at 27.12 MHz: 400 W (1.2 $W/cm^2$)
Power at 430 kHz: 100 W (0.3 $W/cm^2$)
Dielectric constant: 3.6 (200 nm)
Leak current (2 MV/cm): 2.77E-10
Modulus: 55 GPa
Film density: 1.9 $g/cm^3$
Flow rate of inert gas (sccm)/high-frequency power ($W/cm^2$)=236

Example 4

Film thickness: 50 nm
Susceptor temperature: 390° C.
Flow rate of DM-DMOS: 100 sccm
Pressure: 630 Pa
Flow rate of He: 600 sccm
Power at 27.12 MHz: 400 W (1.2 $W/cm^2$)
Power at 430 kHz: 100 W (0.3 $W/cm^2$)
Dielectric constant: 3.98 (200 nm)
Leak current (2 MV/cm): 4.12E-10
Modulus: 89 GPa
Film density: 2.3 $g/cm^3$
Flow rate of inert gas (sccm)/high-frequency power ($W/cm^2$)=471

Example 5

Film thickness: 50 nm
Susceptor temperature: 390° C.
Flow rate of DM-DMOS: 100 sccm
Pressure: 630 Pa
Flow rate of He: 200 sccm
Power at 27.12 MHz: 300 W (0.9 $W/cm^2$)
Power at 430 kHz: 100 W (0.3 $W/cm^2$)
Dielectric constant: 3.5 (200 nm)
Leak current (2 MV/cm): 3.1E-10
Modulus: 50 GPa
Film density: 1.8 $g/cm^3$ Flow rate of inert gas (sccm)/high-frequency power $(W/cm^2)$=209

Example 6

Film thickness: 50 nm
Susceptor temperature: 390° C.
Flow rate of DM-DMOS: 100 sccm
Pressure: 630 Pa
Flow rate of He: 100 sccm
Power at 27.12 MHz: 400 W (1.2 $W/cm^2$)
Power at 430 kHz: 100 W (0.3 $W/cm^2$)
Dielectric constant: 2.9 (200 μm)
Leak current (2 MV/cm): 5.0E-10
Modulus: 20 GPa
Film density: 1.5 $g/cm^3$
Flow rate of inert gas (sccm)/high-frequency power $(W/cm^2)$=79

Example 7

Film thickness: 50 nm
Susceptor temperature: 430° C.
Flow rate of DM-DMOS: 100 sccm
Pressure: 630 Pa
Flow rate of He: 1000 sccm
Power at 27.12 MHz: 900 W (2.8 $W/cm^2$)
Dielectric constant: 3.85 (200 nm)
Leak current (2 MV/cm): 2.00E-10
Withstand pressure: 7 MV/cm
Modulus: 55 GPa
Film density: 2.1 $g/cm^3$
n and k at 193 nm: 1.8 (n), 0.15 (k)
Flow rate of inert gas (sccm)/high-frequency power $(W/cm^2)$=349

Example 8

Film thickness: 50 nm
Susceptor temperature: 430° C.
Flow rate of DMDMOS: 100 sccm
Pressure: 800 Pa
Flow rate of He: 100 sccm
Power at 27 MHz: 500 W (1.5 $W/cm^2$)
Power at 430 kHz: 50 W (0.1 $W/cm^2$)
Dielectric constant: 2.75
Leak current (2 MV/cm): 2.0E-9
Withstand pressure: 6.0 MV/cm
Modulus: 25 GPa
Film density: 1.4 $g/cm^3$
Flow rate of inert gas (sccm)/high-frequency power $(W/cm^2)$=63

Comparative Example 1

Film thickness: 50 nm
Susceptor temperature: 430° C.
Flow rate of DMDMOS: 100 sccm
Pressure: 800 Pa
Flow rate of He: 3000 sccm
Power at 27 MHz: 500 W (1.5 $W/cm^2$)
Power at 430 kHz: 50 W (0.1 $W/cm^2$)
Dielectric constant: 5
Leak current (2 MV/cm): 7.0E-10
Withstand pressure: 6.0 MV/cm
Modulus: 100 GPa
Film density: 2.4 $g/cm^3$
Flow rate of inert gas (sccm)/high-frequency power $(W/cm^2)$=1,885

Comparative Examples 2 to 6

In Comparative Examples (examples of prior art) 2 to 6, a silicon carbide film was deposited under the film deposition conditions shown in Table 1 below and the dielectric constant and density of the obtained film were measured. The obtained film was a SiC film containing N for Comparative Example 2, a SiC film containing N for Comparative Example 3, a SiC film containing N for Comparative Example 4, a SiC film containing 0 for Comparative Example 5, and a SiC film for Comparative Example 6. The results are shown in Table 2.

TABLE 1

| (Film type) | 4MS (sccm) | He (sccm) | NH3 (sccm) | CO2 (sccm) | HRF (W) | LRF (W) | Pressure (Pa) |
|---|---|---|---|---|---|---|---|
| Comparative Example 2 (SiCN) | 400 | 2600 | 1000 | 0 | 400 | 220 | 510 |
| Comparative Example 3 (SiCN) | 400 | 2400 | 1000 | 0 | 400 | 220 | 510 |
| Comparative Example 4 (SiCN) | 250 | 2500 | 250 | 0 | 450 | 100 | 600 |
| Comparative Example 5 (SiCO) | 300 | 2500 | 0 | 450 | 600 | 50 | 533 |
| Comparative Example 6 (SiC) | 300 | 1100 | 0 | 0 | 400 | 95 | 720 |

TABLE 2

| (Film type) | K | Film density (g/cm3) | Sccm/W/cm² |
|---|---|---|---|
| Comparative Example 2 (SiCN) | 5.7 | 2.4 | 2,042 |
| Comparative Example 3 (SiCN) | 5.5 | 2.2 | 1,885 |
| Comparative Example 4 (SiCN) | 4.7 | 2.0 | 1,745 |
| Comparative Example 5 (SiCO) | 4.3 | 1.8 | 1,309 |
| Comparative Example 6 (SiC) | 4 | 1.5 | 864 |

Figure 7:
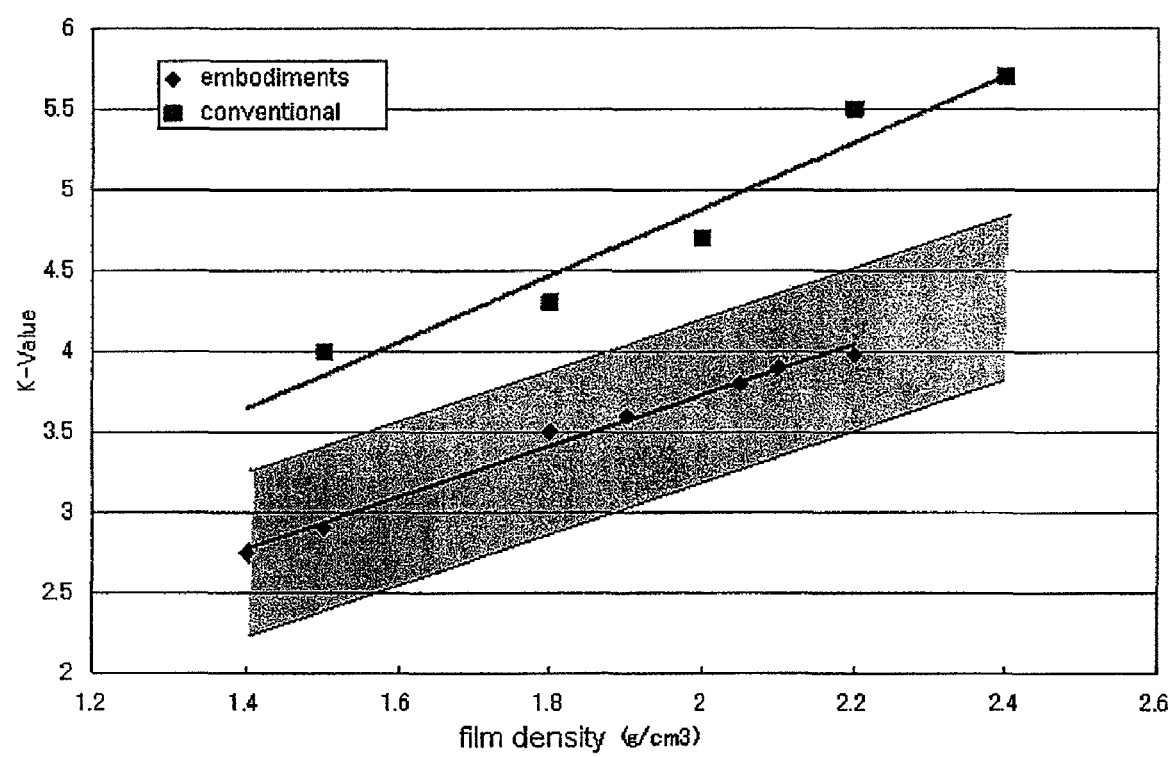
FIG. 7 is a graph showing the relationship between k-value and film density in embodiments of the present invention and the relationship between k-value and film density in conventional films.

The relationship of the dielectric constant (k) and film density (ρ) of each of the silicon carbide films obtained by Examples 1 to 7 are shown in FIG. 7. As shown, the higher the film density, the higher the dielectric constant became, suggesting a substantially proportional relationship between the two. The relational expression of dielectric constant and film density derived from Examples 1 to 7 is as follows:

$$k = 1.591 \cdot \rho + b, \text{ wherein } b \text{ is a constant of } 0.523 \ (\pm 0.3)$$

The gray band in the graph indicates the following range:

$$(1.6 \cdot \rho + a) \leq k \leq (1.6 \cdot \rho + b), \text{ wherein } a=0, b=1.0.$$

With the films obtained by Examples 1 to 7, this band was even narrower where a and b were approx. 0.4 and 0.6, respectively (not illustrated). With the silicon carbide films obtained by Comparative Examples 2 to 6 using the conventional material of methylsilane, on the other hand, the relationship of dielectric constant (k) and film density (ρ) deviated from the aforementioned range. These results show that if the film density is roughly the same as the levels achieved in Examples, the dielectric constant is significantly high. From FIG. 7, it is clear that this embodiment produced films offering a high density as well as a low dielectric constant. Also, the slope (1.591) of the aforementioned relational expression is smaller with the films obtained by Examples than with the films obtained by Comparative Examples. Accordingly, the change in dielectric constant relative to change in density is small with the films obtained by Examples, where the difference from Comparative Examples is evident.

With the film obtained by Comparative Example 1, the relationship was outside the aforementioned range (dielectric constant (k): 5, film density (ρ): 2.4), although the data is not plotted in FIG. 7. Since a desired level is 4.5 or below, or preferably 4.0 or below, for the dielectric constant, the film density may ideally be kept to 2.2 or below according to the aforementioned relationship of dielectric constant (k) and film density (ρ).

Figure 8:
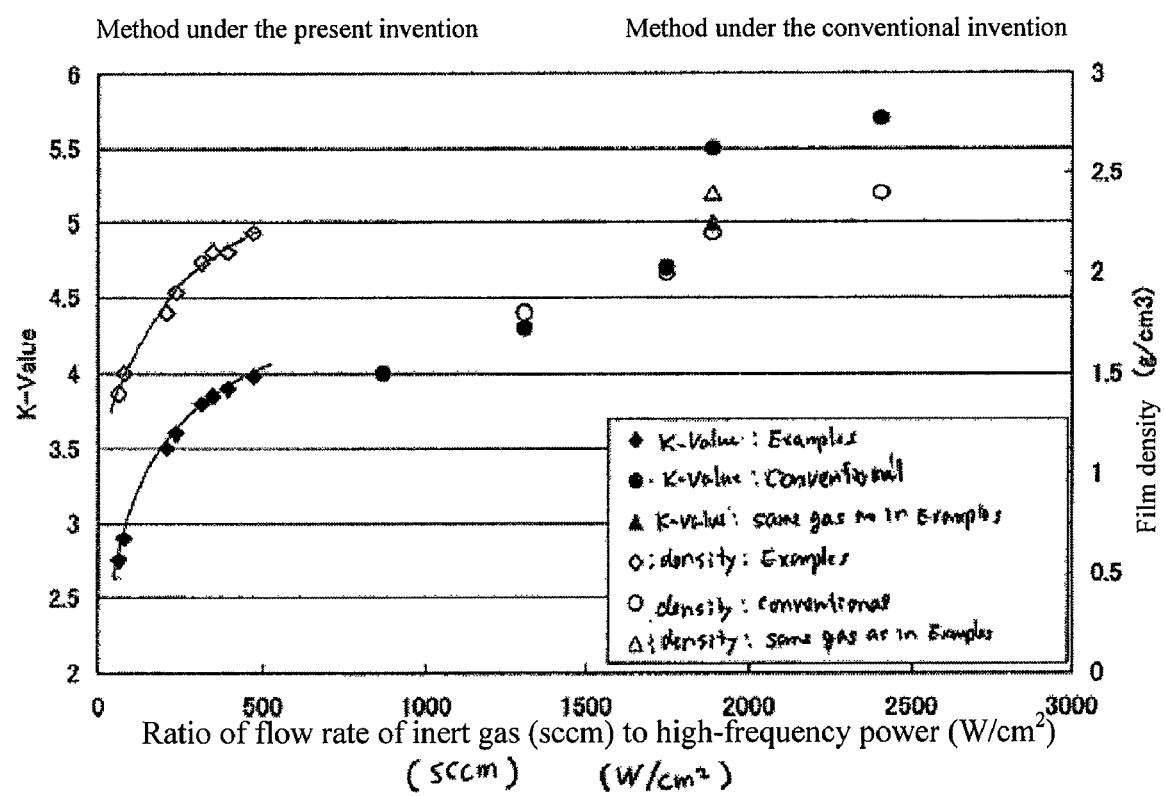
FIG. 8 is a graph showing the relationship between the ratio of inert gas (sccm) to high RF power (W/cm$^2$) and k-value and film density in embodiments of the present invention and the relationship between the ratio of inert gas (sccm) to high RF power (W/cm$^2$) and k-value and film density k-value in conventional films.

FIG. 8 shows the relationship of ratio of inert gas (sccm) to high-frequency power (W/cm$^2$), dielectric constant (k), and film density (ρ). As shown, with the films obtained by Examples 1 to 7 the dielectric constant (k) and film density (ρ) can be controlled by means of controlling the aforementioned ratio. Also, while the aforementioned ratio was approx. 500 or below with the films obtained by Examples 1 to 7, in other embodiments the ratio can be controlled at 1250 or below, or preferably 850 or below. The ratio was 863 with the film obtained by Comparative Example 6, but this film was a SiC silicon carbide film not containing impurities and thus different from other films examined here. With the SiCO film obtained by Comparative Example 5, the ratio was 1309, which is outside the control ranges applicable to Examples or specified in other embodiments. The films obtained by Comparative Examples 1 to 5 had even higher ratios, deviating further from the control ranges applicable to Examples or specified in other embodiments. As a result, the dielectric constant (k) increased with respect to the film density (ρ), as explained in FIG. 7. FIG. 8 also shows that with the films obtained by Examples, the dielectric constant was significantly lower relative to the film density. (With the films obtained by Examples, the relative positions of film density and dielectric constant were significantly apart in the graph in FIG. 8, with the dielectric constant trending much lower.)

It is estimated that in this embodiment, use of a material containing Si—O bond caused this structure to be incorporated directly into the film, and accordingly no additive gas such as $O_2$ nor oxidizing agent such as $O_2$, $CO_2$ or $N_2O$ was used. On the other hand, the Si—O bond formed by methylsilane and oxidizing gas is the result of a decomposition reaction and thus the density of a film containing this bond tends to be lower. At a lower density, therefore, the dielectric constant does not drop as much as under this embodiment. This indicates an advantage of this embodiment over the conventional method.

Figure 3:
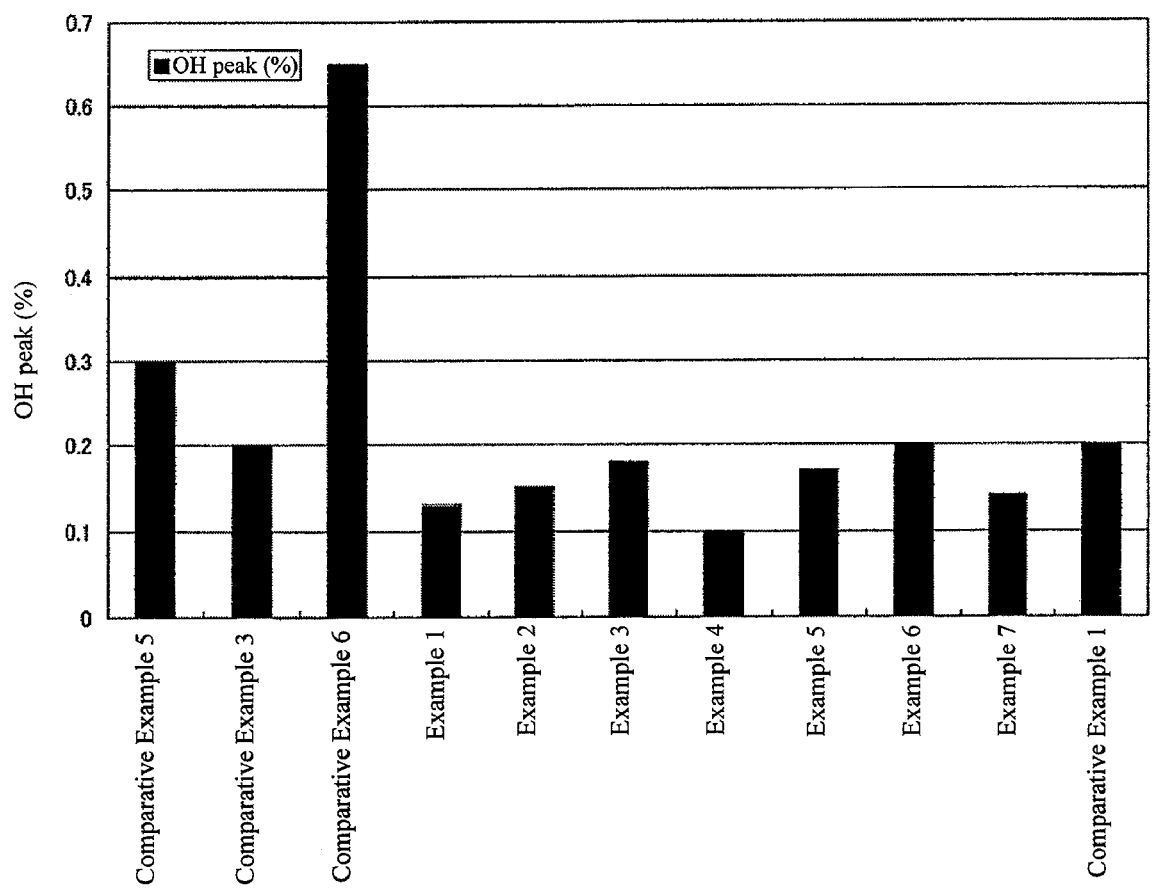
FIG. 3 is a graph showing results of moisture penetration tests wherein the degree of moisture penetration is evaluated by the area (%) of the peak corresponding to Si—OH bond shown in FT-IR data after the test.

FIG. 3 shows the moisture penetrations of films obtained by Examples 1 to 7 and Comparative Examples 1, 3, 5 and 6, indicated by Si—OH peaks obtained by FT-IR analysis. A lower OH peak indicates that moisture penetration is suppressed more. In this evaluation of moisture penetration, the films were kept in an atmosphere of 120° C. and 75 to 85% humidity for 10 hours, after which Si—OH peaks were measured by FT-IR analysis.

From the evaluation results of moisture penetration, the films conforming to the present invention exhibited moisture penetration resistance better than, or at least equivalent to, the levels achieved with conventional SiCN and SiCO films (0.2% or less based on OH peaks). Here, since the silicon carbide films obtained by Examples had lower dielectric constants than SiCN and SiCO films, their moisture penetration resistance is clearly better than the films obtained by Comparative Examples. In particular, their superiority in moisture penetration resistance over the conventional SiC film is indisputable. In view of the worst moisture permeation result of the pure SiC film, it is considered that nitrogen or oxygen groups is required to be added if a pure SiC film is to be used.

Figure 4:
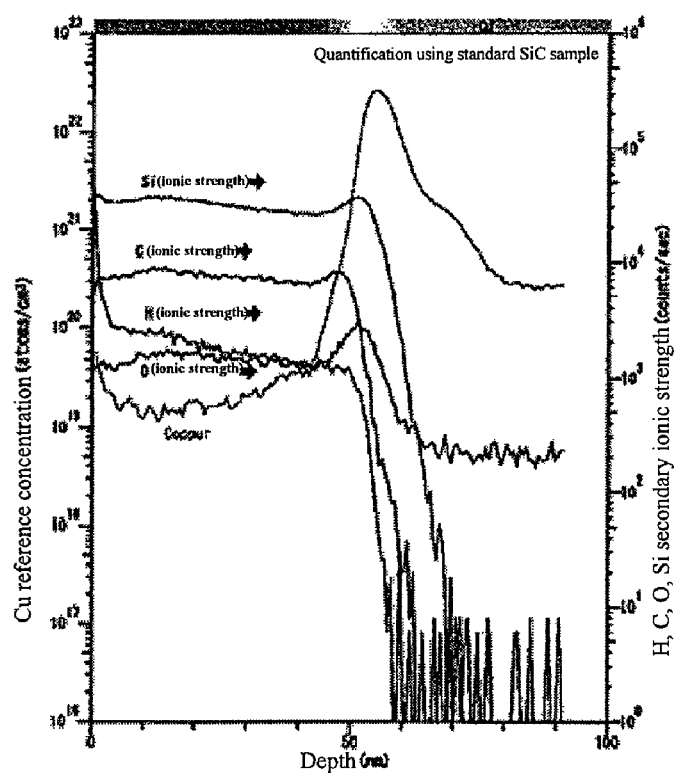
FIG. 4 is SIMS data of a low-k film (having a dielectric constant of 3.1) showing copper diffusion throughout the film.
Figure 5:
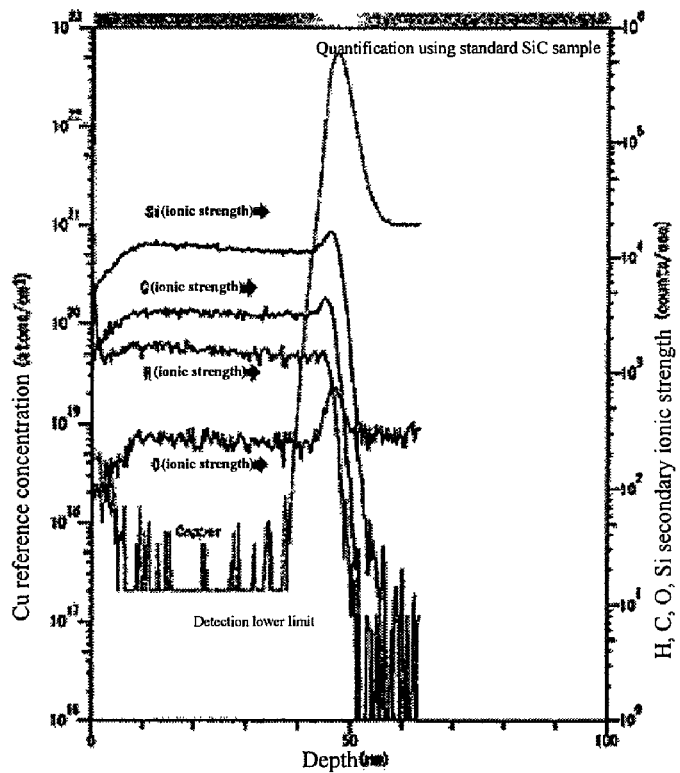
FIG. 5 is SIMS data of a SiCN barrier film formed according to an embodiment of the present invention, which shows no copper diffusion in a depth of 10 μm or more.
Figure 6:
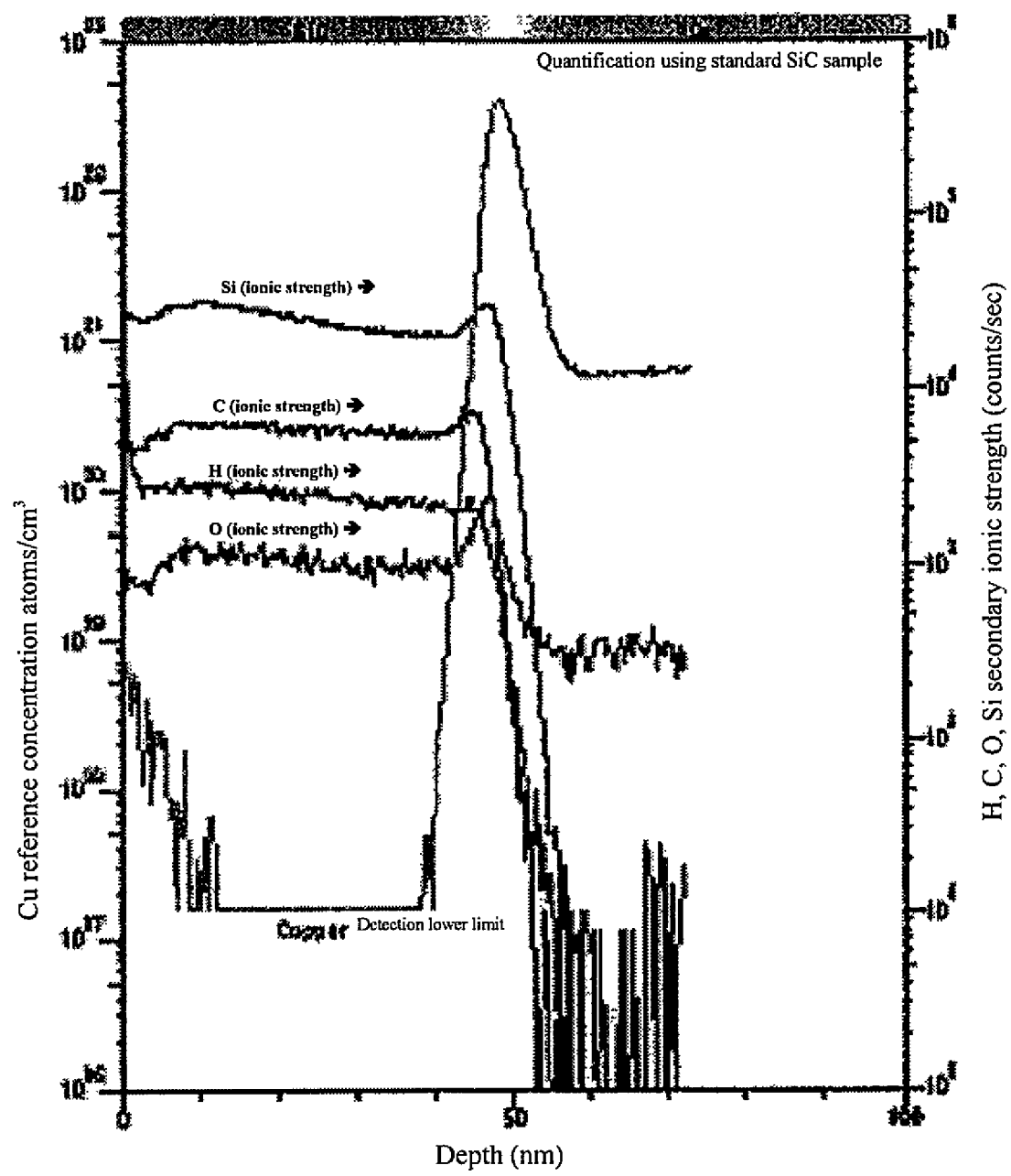
FIG. 6 is SIMS data of a SiCO film formed according to an embodiment of the present invention, which shows no copper diffusion in a depth of 10 μm or more.

In the Cu-diffusion blocking test, a silicon carbide film was deposited by 50 nm on a wafer on which Cu had been deposited, after which the obtained silicon carbide film was left in a 400° C. atmosphere for 4 hours, and acceptance of Cu diffusion was evaluated based on a criterion of 20 nm or less. FIGS. 4 through 6 show the conditions of Cu diffusion measured by SIMS.

FIG. 4 shows the result of a conventional low-dielectric-constant insulation film with a dielectric constant of 3.1. Since Cu was away from the detection limit, Cu must have diffused into the low-dielectric-constant insulation film. FIG. 5 applies to a conventional SiCN-based Cu-diffusion blocking film with a dielectric constant of 4.8 (equivalent to the film obtained by Comparative Example 3). Since Cu is below the detection limit, the film was blocking Cu diffusion. FIG. 6 shows the result of the SiCO film obtained by Example 3. As with the SiCN film, Cu is below the detection limit and thus the film was functioning sufficiently as a Cu-diffusion blocking film.

In summary, according to this embodiment a thin film of approx. 30 nm can also be used as a barrier film, and the total dielectric constant over the entire wiring layers, or $K_{effect}$, can be lowered. The present invention is particularly useful with 45 to 32-nm devices, as the dielectric constants required of silicon carbide films serving as barrier films are becoming lower with these devices.

Figure 2:
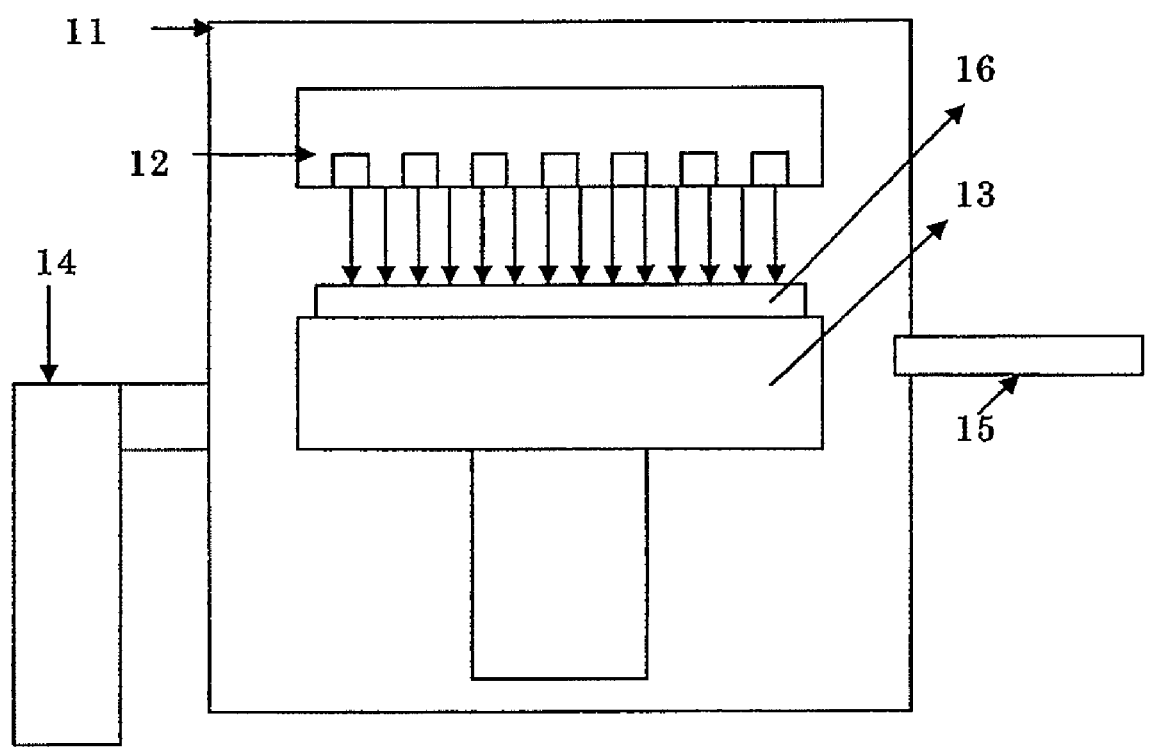
FIG. 2 is a schematic diagram showing a UV curing apparatus according to an embodiment of the present invention.

If the film stability must be increased further, the semiconductor substrate is cured in the UV cure apparatus shown in FIG. 2. UV irradiation has the effect of removing unstable bonds to make the film more stable, suppressing moisture absorption from outside, and also improving the film strength.

Example 8

Film thickness: 50 nm
Susceptor temperature: 375° C.
Flow rate of DMDMOS: 150 sccm
Pressure: 630 Pa
Flow rate of He: 1500 sccm
Power at 27.12 MHz: 1100 W (3.50 W/cm$^2$)
Dielectric constant: 4.5 (200 nm)
Leak current (2 MV/cm): 2.40E-9
Withstand pressure: 8 MV/cm
Modulus: 57 GPa
Film density: 2.2 g/cm3
n and k at 193 nm: 1.8 (n), 0.21 (k)
Flow rate of inert gas/high-frequency power=1.36 sccm/W (428 sccm/W/cm$^2$)

Example 9

Film thickness: 50 nm
Susceptor temperature: 430° C.

Flow rate of DMDMOS: 100 sccm
Pressure: 630 Pa
Flow rate of He: 1500 sccm
Power at 27 MHz: 700 W (2.23 W/cm$^2$)
Dielectric constant: 4.3 (200 nm)
Leak current (2 MV/cm): 3.0E-9
Withstand pressure: 6.0 MV/cm
Modulus: 130 GPa
Film density: 2.1 g/cm$^3$
Flow rate of inert gas/high-frequency power=2.14 sccm/W (673 sccm/W/cm$^2$)

Figure 9:
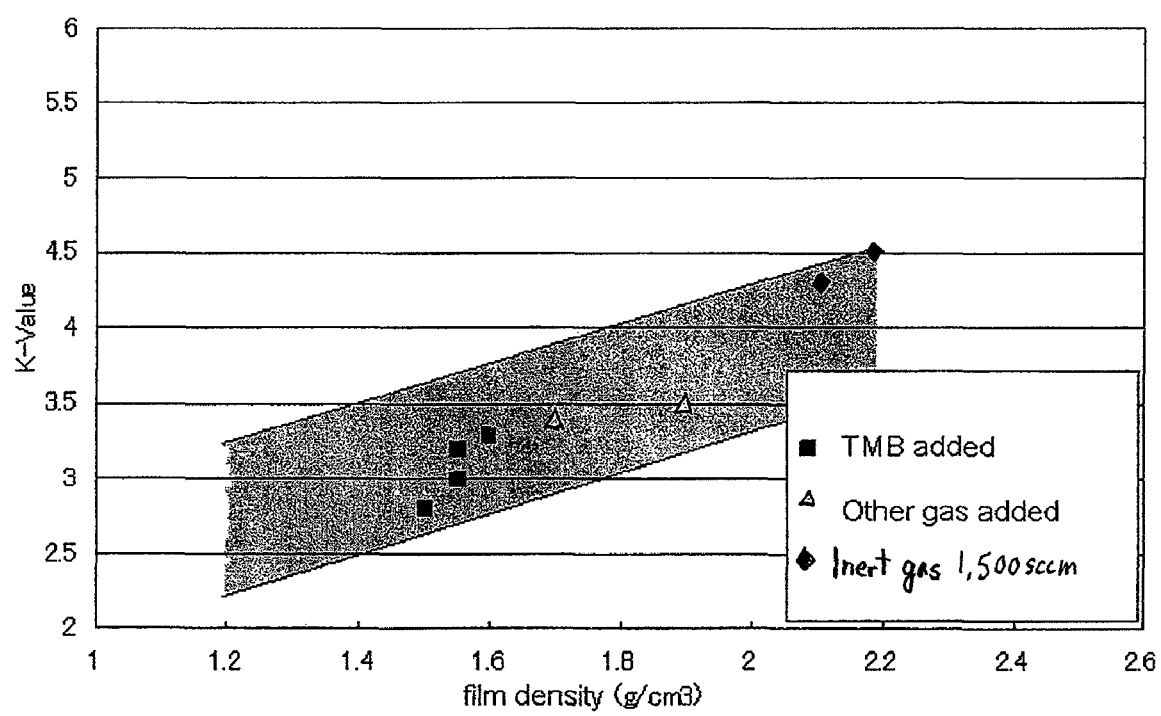
FIG. 9 is a graph showing the relationship between k-value and film density in other embodiments of the present invention.

In Examples 8 and 9, a silicon carbide film was deposited by increasing the flow rate of the inert gas to 1500 sccm. FIG. 9 shows the relationship of dielectric constant (k) and film density (ρ) (indicated by ♦). As in FIG. 7, a gray band is shown that represents the following range:

$$(1.6 \cdot \rho + a) \leq k \leq (1.6 \cdot \rho + b), \text{ wherein } a=0, b=1.0.$$

Figure 10:
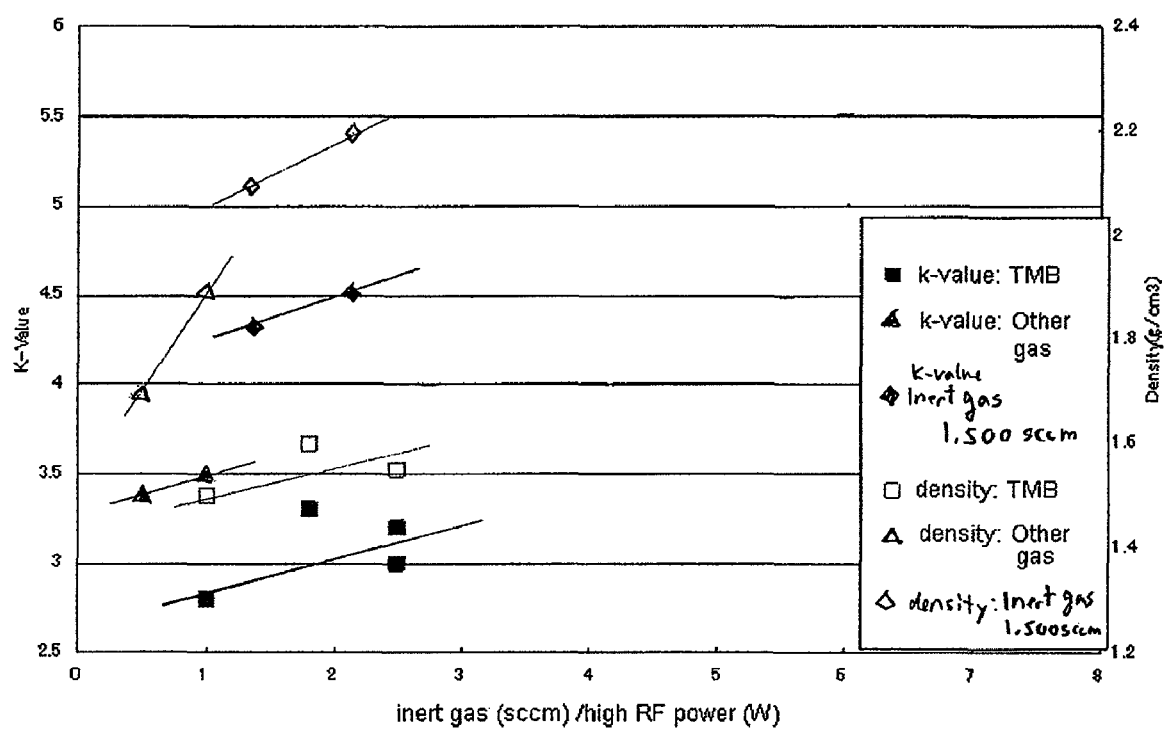
FIG. 10 is a graph showing the relationship between the ratio of inert gas (sccm) to high RF power (W) and k-value and film density in other embodiments (Φ200 mm substrate) of the present invention.

Although the films obtained by Examples 8 and 9 fell within the aforementioned range, the data points were near the upper limit of the range. FIG. 10 shows the relationship of ratio of inert gas (sccm) to high-frequency power (W), dielectric constant (k), and film density (ρ). It is shown that with the films obtained by Examples 8 and 9, the dielectric constant (k) and film density (ρ) can also be controlled by means of controlling the aforementioned ratio. Here, unlike in FIG. 8 the ratio to high-frequency power represented by the horizontal axis in FIG. 10 is not a value per unit substrate area. Corresponding values per unit substrate area can be calculated by multiplying the values read off from the horizontal axis by 100π. The ratio per unit substrate area was 428 with the film obtained by Example 8 and 637 with the film obtained by Example 9. When the flow rate of the inert gas became approx. 1500 sccm, lowering of the dielectric constant was suppressed to a greater degree compared to when the flow rate of the inert gas was lower.

Example 10

Film thickness: 50 nm
Susceptor temperature: 375° C.
Flow rate of DMOTMDS: 100 sccm
Flow rate of TMB ($C_6H_3(CH_3)_3$): 50 sccm
Pressure: 533 Pa
Flow rate of He: 1 SLM
Power at 27 MHz: 400 W (1.27 W/cm$^2$)
Power at 400 kHz: 50 W
Dielectric constant: 3.0 (200 nm)
Leak current (2 MV/cm): 2.7E-9
Withstand pressure: 6.0 MV/cm
Modulus: 30 GPa
Film density: 1.55 g/cm$^3$
Flow rate of inert gas/high-frequency power=2.5 sccm/W (785 sccm/W/cm$^2$)

Example 11

Film thickness: 50 nm
Susceptor temperature: 375° C.
DMOTMDS: 300 sccm
Flow rate of TMB: 200 sccm
Pressure: 266 Pa
Flow rate of He: 900 sccm
Power at 27 MHz: 500 W (1.59 W/cm$^2$)
Power at 400 kHz: 100 W
Dielectric constant: 3.3 (200 nm)
Leak current (2 MV/cm): 1.5E-9
Withstand pressure: 6.0 MV/cm
Modulus: 50 GPa
Film density: 1.60 g/cm$^3$
Flow rate of inert gas/high-frequency power=1.8 sccm/W (565 sccm/W/cm$^2$)

Example 12

Film thickness: 50 nm
Susceptor temperature: 375° C.
Flow rate of HMDSO: 150 sccm
Flow rate of TMB: 150 sccm
Pressure: 533 Pa
Flow rate of He: 1000 sccm
Power at 27 MHz: 400 W (1.27 W/cm$^2$)
Power at 400 kHz: 50 W
Dielectric constant: 3.2 (200 nm)
Leak current (2 MV/cm): 1.5E-9
Withstand pressure: 6.0 MV/cm
Modulus: 45 GPa
Film density: 1.55 g/cm$^3$
Flow rate of inert gas/high-frequency power=2.5 sccm/W (785 sccm/W/cm$^2$)

Example 13

Film thickness: 50 nm
Susceptor temperature: 430° C.
Flow rate of DM-DMOS: 100 sccm
Flow rate of TMB: 0 sccm
Pressure: 630 Pa
Flow rate of He: 1000 sccm
Power at 27.12 MHz: 900 W (2.86 W/cm$^2$)
Dielectric constant: 3.95 (200 nm)
Leak current (2 MV/cm): 2.00E-10
Withstand pressure: 7 MV/cm
Modulus: 55 GPa
Film density: 2.0 g/cm$^3$
n and k at 193 nm: 1.8 (n), 0.15 (k)
Flow rate of inert gas/high-frequency power=1.1 sccm/W (349 sccm/W/cm$^2$)

Example 14

Film thickness: 50 nm
Susceptor temperature: 375° C.
Flow rate of DMDMOS: 150 sccm
Flow rate of TMB: 30 sccm
Pressure: 630 Pa
Flow rate of He: 1000 sccm
Power at 13.56 MHz: 1000 W (3.18 W/cm$^2$)
Power at 400 kHz: 150 W
Dielectric constant: 2.8 (200 nm)
Leak current (2 MV/cm): 7.90E-10
Withstand pressure: 7.2 MV/cm
Modulus: 39 GPa
Film density: 1.5 g/cm$^3$
n and k at 193 nm: 1.6 (n), 0.12 (k)
Flow rate of inert gas/high-frequency power=1.0 sccm/W (314 sccm/W/cm$^2$)

In Examples 10 to 14, a silicon carbide film was deposited using a hydrocarbon gas as an additive gas. FIG. 9 shows the relationship of dielectric constant (k) and film density (ρ) (indicated by ■). All of the films obtained by Examples 10 to 14 fell inside the gray band whose definition is the same as in FIG. 7. FIG. 10 shows the relationship of ratio of inert gas (sccm) to high-frequency power (W), dielectric constant (k), and film density (ρ). It is shown that, with the films obtained by Examples 10 to 14, the dielectric constant (k) and film density (ρ) can also be controlled by means of controlling the aforementioned ratio. However, the controllability was reduced compared to when a hydrocarbon was not used. Here, unlike in FIG. 8 the ratio to high-frequency power represented by the horizontal axis in FIG. 10 is not a value per unit substrate area. Corresponding values per unit substrate area can be calculated by multiplying the values read off from the horizontal axis by 100π. The ratios per unit substrate area were 785, 565, 785, 349 and 314 for the films obtained by Examples 10, 11, 12, 13 and 14, respectively. Although the controllability is reduced compared to when a hydrocarbon was not used, it is shown that lowering of the dielectric constant can be promoted when a hydrocarbon gas is used.

Example 15

Film thickness: 50 nm
Susceptor temperature: 395° C.
Flow rate of DMDMOS: 150 sccm
Pressure: 630 Pa
Flow rate of He: 300 sccm
Flow rate of $CO_2$: 2000 sccm
Power at 27 MHz: 300 W (0.95 W/$cm^2$)
Power at 400 kHz: 100 W
Dielectric constant: 3.5 (200 nm)
Leak current (2 MV/cm): 2.5E-10
Withstand pressure: 6.0 MV/cm
Modulus: 100 GPa
Film density: 1.9 g/$cm^3$
Flow rate of inert gas/high-frequency power=1.0 sccm/W (314 sccm/W/$cm^2$)

Example 16

Film thickness: 50 nm
Susceptor temperature: 390° C.
Flow rate of DMDMOS: 150 sccm
Pressure: 630 Pa
Flow rate of He: 150 sccm
Flow rate of $H_2$: 200 sccm
Power at 27 MHz: 300 W (0.95 W/$cm^2$)
Power at 400 kHz: 100 W
Dielectric constant: 3.4 (200 nm)
Leak current (2 MV/cm): 3.0E-9
Withstand pressure: 6.0 MV/cm
Modulus: 80 GPa
Film density: 1.7 g/$cm^3$
Flow rate of inert gas/high-frequency power=1.5 sccm/W (157 sccm/W/$cm^2$)

In Examples 15 and 16, a silicon carbide film was deposited by using $CO_2$ and $H_2$ gases as additive gases. As with $H_2$, $CO_2$ is used not to build a Si—O bond, but to stabilize the end of the Si structure. When an additive gas having this effect is used, a silicon carbide film can be obtained that exhibits excellent moisture penetration resistance corresponding to 0.1% or below in OH peak percentage shown in FIG. 3 as measured by the moisture penetration resistance test (the film obtained by Example 15 had an OH peak of 0.075%, while the one obtained by Example 16 had an OH peak of 0.05%). However, these additive gases are not used with certain film structures, because if the foundation layer is Cu, etc., these gases may oxidize the foundation layer. FIG. 9 shows the relationship of dielectric constant (k) and film density (ρ) (indicated by Δ). Both of the films obtained by Examples 15 and 16 fell inside the gray band whose definition is the same as in FIG. 7. FIG. 10 shows the relationship of ratio of inert gas (sccm) to high-frequency power (W), dielectric constant (k), and film density (ρ). It is show that, with the films obtained by Examples 15 and 16, the dielectric constant (k) and film density (ρ) can also be controlled by means of controlling the aforementioned ratio. Here, unlike in FIG. 8 the ratio to high-frequency power represented by the horizontal axis in FIG. 10 is not a value per unit substrate area. Corresponding values per unit substrate area can be calculated by multiplying the values read off from the horizontal axis by 100π. The ratio per unit substrate area was 314 for the film obtained by Example 15 and 157 for the film obtained by Example 16.

The present invention includes the above mentioned embodiments and other various embodiments including the following:

1) A method for forming a barrier film or anti-refractive film to be deposited on a semiconductor substrate, wherein specifically a silicon carbide film expressed by $Si_aC_bO_cH_d$ or $Si_aC_bO_cN_dH_e$ (in the formulas, a, b, c, d and e are arbitrary integers) is formed. The aforementioned silicon carbide film uses a precursor having Si—O bond to obtain a higher density and stability compared to conventional silicon carbide films.

2) The method according to 1) above, wherein no oxidizing agent is used because a material having Si—O bond is selected.

3) The method according to 1) or 2) above, wherein the ratio of the flow rate of the inert gas to the RF power is controlled to achieve high density at a dielectric constant of 4.0 or less and also add a Cu-diffusion blocking function.

4) The method according to 3) above, wherein the ratio of the inert gas (sccm) to the RF power (W) is in a range of 4:1 to 1:6 (based on a substrate of 200 mm in diameter).

5) The method according to any one of 1) through 4) above, wherein the flow rate of the inert gas is less than 1100 sccm.

6) The method according to any one of 1) through 5) above, wherein a film having the function of anti-refractive film is formed for lithography in addition to the silicon carbide film.

7) The method according to any one of 1) through 6) above, wherein nitrogen groups are contained in the film to further enhance the stability and improve the selectivity with respect to the insulation film.

8) The method according to any one of 1) through 7) above, wherein the silicon hydrocarbon compound corresponds to the substance disclosed in U.S. Pat. No. 6,455,445.

9) The method according to any one of 1) through 8) above, wherein the dilution gas is selected from among $N_2$, He, R, Kr, Xe and all combinations thereof.

10) The method according to any one of 1) through 9) above, wherein the flow rate of the dilution gas is in a range of 10 sccm to 1000 sccm.

11) The method according to any one of 1) through 10) above, wherein the temperature of the processed semiconductor substrate is in a range of 50° C. to 550° C.

12) The method according to any one of 1) through 11) above, wherein the frequency of the high-frequency power used is selected from among 13.56 MHz, 27 MHz and 60 MHz.

13) The method according to any one of 1) through 12) above, wherein a power combining two frequencies, or specifically combining a high-frequency power of 13.56 MHz, 27 MHz or 60 MHz and a low-frequency power of 5 MHz or below (430 kHz, 400 kHz, etc.), is used.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a silicon carbide film containing Si, C, O, H, and optionally N on a substrate placed in a reaction space, comprising:

introducing into the reaction space a precursor gas containing Si, C, O, and H and having at least one Si—O bond in its molecule, the precursor is selected from the group consisting of dimethyldimethoxysilane (DMDMOS), diethyldiethoxysilane (DEDEOS), phenyltrimethoxysilane (PTMOS), 1,3-dimethoxytetramethyl disilane (DMOTMDS), and hexamethydisilane (HMDS);

introducing into the reaction space an inert gas independently of the precursor gas, said inert gas being selected from the group consisting of He, Ar, Kr, and Xe;

applying RF power in the reaction space to form a silicon carbide film containing Si, C, O, H, and optionally N; and adjusting a ratio of a flow rate (sccm) of the inert gas to the RF power density (W/cm$^2$) as a parameter in a range of 200 to 550 so as to form a silicon carbide film having a dielectric constant of 3.5 to 3.98 and a density of higher than 1.5 g/cm$^3$ but less than 2.4 g/cm$^3$.

2. The method according to claim 1, wherein the ratio of the flow rate of the inert gas to the RF power is controlled to adjust a dielectric constant (k) and a density ($\rho$, g/cm$^3$) of the depositing silicon carbide film to satisfy the following equation:

$$1.6 \cdot \rho \leq k \leq 1.6 \cdot \rho + 1.0.$$

3. The method according to claim 1, wherein in the reaction space, the RF power is applied at 1-5 W/cm$^2$, and the inert gas is introduced at a flow rate of less than 1,100 sccm.

4. The method according to claim 1, wherein no oxidizing gas is added to the precursor gas.

5. The method according to claim 1, wherein the precursor gas and the inert gas are exclusively introduced into the reaction space.

6. The method according to claim 1, wherein the silicon carbide film is deposited at a thickness of 10-50 nm.

7. The method according to claim 1, wherein the RF power has a high frequency and a low frequency, said high frequency being 13.56 MHz, 27 MHz, or 60 MHz, said low frequency being 5 MHz or lower.

8. The method according to claim 1, wherein the inert gas is nitrogen gas to incorporate N in the silicon carbide film which contains Si, C, O, H, and N.

9. The method according to claim 1, wherein, in the step of introducing the inert gas, a hydrocarbon gas consisting of C and H atoms is also introduced into the reaction space.

* * * * *